United States Patent [19]
Cruickshank et al.

[11] Patent Number: 5,109,503
[45] Date of Patent: Apr. 28, 1992

[54] APPARATUS WITH RECONFIGURABLE COUNTER INCLUDES MEMORY FOR STORING PLURALITY OF COUNTER CONFIGURATION FILES WHICH RESPECTIVELY DEFINE PLURALITY OF PREDETERMINED COUNTERS

[75] Inventors: Ancil B. Cruickshank, Earlysville; Richard K. Davis, Crozet, both of Va.

[73] Assignee: GE Fanuc Automation North America, Inc., Charlottesville, Va.

[21] Appl. No.: 355,266

[22] Filed: May 22, 1989

[51] Int. Cl.⁵ .............................................. G06F 15/60
[52] U.S. Cl. ............................ 395/500; 364/DIG. 1; 364/244.8; 364/243; 364/244.6; 364/DIG. 2; 364/927.81
[58] Field of Search ... 364/200 MS File, 900 MS File

[56] References Cited

U.S. PATENT DOCUMENTS

| | | | |
|---|---|---|---|
| 4,031,517 | 6/1977 | Hirtle | 364/200 |
| 4,674,089 | 6/1987 | Poret et al. | 364/200 |
| 4,751,671 | 6/1988 | Bebetski et al. | 364/900 |
| 4,924,382 | 5/1990 | Shouda | 364/200 |
| 4,964,056 | 10/1990 | Bekki et al. | 364/488 |

OTHER PUBLICATIONS

Xilinx Technical Data, XC3000 Logic Cell TM Array Family, Copyright 1988.

*Primary Examiner*—Thomas C. Lee
*Assistant Examiner*—Mehmet Geckil
*Attorney, Agent, or Firm*—James H. Beusse

[57] ABSTRACT

A reconfigurable counter is provided which includes first and second memories coupled via a common bus to a microprocessor which controls the process of configuring and reconfiguring the counter. A programmable hardware array, coupled to the microprocessor, is capable of being programmed to emulate a plurality of different counter types. The first memory stores a plurality of different counter configuration profiles, each of which corresponds to a different type counter configuraiton. In one or more of the selected counter types, different counter modes such as an up-down counter mode, pulse direction counter mode and A quad B counter modes are available. When the user indicates a selected counter profile to the microprocessor, the microprocessor writes the corresponding counter configuration profile from the first memory into the programmable hardware array using the parameters or modes of operation stored in the second memory until such time as the user indicates the choice of another counter profile to the microprocessor.

21 Claims, 7 Drawing Sheets

APPARATUS WITH RECONFIGURABLE COUNTER INCLUDES MEMORY FOR STORING PLURALITY OF COUNTER CONFIGURATION FILES WHICH RESPECTIVELY DEFINE PLURALITY OF PREDETERMINED COUNTERS

BACKGROUND OF THE INVENTION

This invention relates in general to high speed counters working in conjunction with programmable logic controllers, electronic processors, or other host or operator interface devices. More particularly, the invention relates to an apparatus and method for providing a high speed counter which is reconfigurable to one of several counter configurations.

BRIEF SUMMARY OF THE INVENTION

In the field of industrial and process control, a programmable logic controller (PLC) or industrial computer is frequently used to monitor input signals from a variety of input sensors which report events and conditions occurring in a controlled process. A PLC, for example, can monitor such input conditions as temperature, pressure, volumetric flow and the like. A control program is stored in a memory to instruct the PLC as to what actions to take upon encountering particular input signals or conditions. In response to these input signals, the PLC derives and generates output signals which are transmitted to various output devices to control the implementation of the process. For example, the PLC issues output signals to open or close a relay, raise or lower temperature and pressure, or control the speed of a conveyer, as well as many other control functions.

Very often, however, process data input represented by pulse trains must be counted at rates which exceed the normal capabilities of the PLC or the computer as the case may be. Moreover, differential or quadrature inputs may be required which are often difficult or impossible to handle in conventional PLC ladder logic. For these reasons, high speed counters (HSC's) of varying design and complexity have been used in conjunction with PLC's.

Typically, the PLC is programmed to acquire count information from a dedicated counter at selected times determined by the application. For some applications, simple up/down counters are required. For other applications more complex counters such as A quad B counters or bidirectional counters are required. It is apparent that a designer of PLC's which employ high speed counters is confronted with a wide range of different hardware counter types. These counter types are coupled in diverse ways to a PLC, each counter type having its own type of interface with the PLC.

In PLC applications several counters are often employed. The total number of counters used in a PLC application tends to be inversely related to the counter complexity. That is, the greater the number of counters used in a particular application, generally the lesser is the complexity of each counter. Conversely, when fewer counters are employed in a PLC application, such counters generally tend to be more complex. The quantity and diversity of counters which an electronics distributor or user must stock in inventory to fulfill such varying requirements is thus seen to be relatively large.

One object of the present invention is to provide a high speed counter (HSC) which may be programmably reconfigured to one of several different hardware counter configurations.

Another object of the present invention is to obviate the need for stocking several different types of high speed counters for use in conjunction with PLC's or other host devices.

In accordance with one embodiment of the present invention, a reconfigurable counter is provided including a memory for storing a plurality of user selectable counter profiles, each counter profile corresponding to a different type of counter configuration. The counter includes a selector, operatively coupled to the memory, for indicating a selected counter profile desired for the counter. The counter further includes a programmable hardware logic array, responsive to the selector, and which is configurable to exhibit the counter configuration corresponding to the selected profile.

In accordance with another embodiment of the reconfigurable counter of the invention, a reconfigurable counter is provided which includes a microprocessor for controlling the configuration and reconfiguration of the counter. The counter includes a first memory, coupled to the microprocessor, for storing a plurality of user selectable counter profiles, each counter profile corresponding to a different type of counter configuration. The counter further includes a selector, coupled to the microprocessor, for permitting a user to select one of the counter profiles stored in the first memory. The profile which is selected by the user is designated the selected profile. The counter also includes a second memory, coupled to the microprocessor, for storing various user selectable parameters (or modes of operation) for each configuration. A programmable hardware logic array is coupled to the microprocessor. The programmable hardware logic array is configured to exhibit a counter configuration corresponding to the selected profile stored in the first memory and having user parameters from the second memory. To configure or reconfigure the programmable hardware logic array of the counter, the microprocessor causes the selected profile of the first memory to be imposed on (or written to) the programmable hardware logic array so that it exhibits a counter configuration corresponding to the selected counter profile and having the user parameters of the second memory.

In yet another embodiment of the invention, a reconfigurable counter apparatus is provided which includes a memory for storing at least first and second user selectable counter profiles, the first profile corresponding to a plurality of counters exhibiting a first counter type, the second profile corresponding to first and second counters each of which are capable of assuming first and second user selectable modes. The counter apparatus further includes a first selecting device, operatively coupled to the memory, for selecting a desired counter profile for the reconfigurable counter apparatus thus designating one of the first and second counter profiles as being a selected counter profile. The counter apparatus includes a second selecting device, operatively coupled to the memory, for selecting a desired mode for each of the first and second counters when the selected counter profile is the second counter profile. For convenience, the second selecting device may be combined with the first selecting device. The counter apparatus further includes a programmable hardware logic array, responsive to the first and second selecting devices, for exhibiting a counter configuration corresponding to the selected counter profile and any selected modes.

Although for purposes of example, the reconfigurable counter discussed and shown herein is being used in conjunction with a PLC, the counter need not necessarily be used with a PLC. It may indeed be used with various host devices (such as a personal computer) or be used "stand-alone" with various operator interface devices such as the typical keyboard or keypad. Other applications will be apparent to those skilled in the art.

BRIEF DESCRIPTION OF THE DRAWINGS

The features of the invention believed to be novel are specifically set forth in the appended claims. However, the invention itself, both as to its structure and method of operation, may best be understood by referring to the following description taken in conjunction with the accompanying drawings in which:

DETAILED DESCRIPTION OF THE INVENTION

Figure 1:
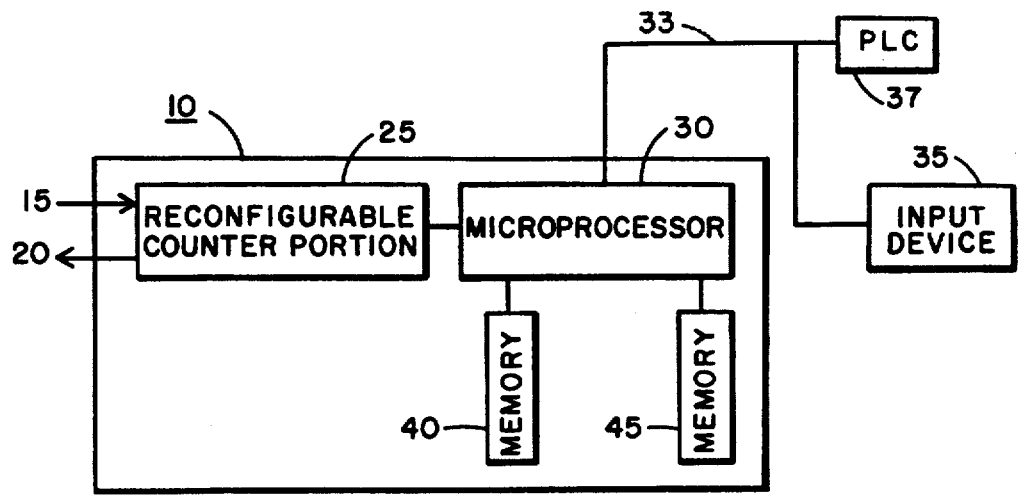
FIG. 1 is a generalized block diagram of a reconfigurable high speed counter in accordance with the teachings of the present invention.

In accordance with one embodiment of the present invention, FIG. 1 shows a high speed counter (HSC) 10 including a plurality of counter inputs 15 and a plurality of counter outputs 20. In one application of the invention, counter inputs 15 are supplied with data signals from a controlled process (not shown), although clearly the invention may be used to monitor other data signals as well. HSC 10 further includes a reconfigurable counter portion 25 which is configurable in a plurality of different counter topologies to provide different user-selectable counter characteristics. Counter inputs 15 and counter outputs 20 extend from counter portion 25. A microprocessor 30 is coupled to reconfigurable counter portion 25 to enable microprocessor 30 to instruct counter portion 25 which counter configuration to exhibit.

An input device 35 such as the Genius Input/Output hand-held monitor manufactured by G. E. Fanuc Automation N.A., Inc. (G. E. Fanuc) is coupled via a bus 33 to microprocessor 30 to enable the user to instruct microprocessor 30 as to which one of a plurality of counter configurations is desired. The Genius I/O bus designed by G. E. Fanuc is an example of one bus which may be employed as bus 33. More information with respect to these devices is disclosed in published product bulletins on these products and are available from GE Fanuc Automation N.A., Inc., Charlottesville, Va.

A plurality of different counter configuration parameter files are stored in a non-volatile memory 40 which is coupled to microprocessor 30. A programmable read only memory (PROM) such as an erasable programmable read only memory (EPROM), for example, is conveniently used as memory 40 although other types of memories may be employed as well. In one embodiment of the invention, the user selects one of three counter configuration parameter files which are stored in memory 40 by indicating such choice on input device 35. On command from input device 35, or upon power up microprocessor 30 selects one of the three counter configuration parameter files in memory 40 and causes microprocessor 30 to program the selected counter configuration into the reconfigurable counter portion 25. A second memory 45, which may be electrically erasable (e.g., an EEPROM), but which is preferably nonvolatile in any case, stores various user parameters which are selectable for further mode configuration of the selected counter profile. Memory 45 also serves as a pointer or selector device since microprocessor 30 looks to that memory for instructions as to which configuration from memory 40 is to be selected. The user parameters of memory 45 are imposed on the selected configuration programmed into the reconfigurable counter portion 25.

Also connected to bus 33 is a programmable logic controller (PLC) 37 which derives information from high speed counter 10 in the usual mode of operation of programmable logic controllers used in conjunction with high speed counters. That is, from time to time PLC 37 acquires count information from counter 10 as the requirements of the particular application dictate. It will be apparent, however, that PLC 37 and input device 35 may be combined into a single host device, such as a personal computer. Alternatively, if no control functionality is desired, the configurable counter of the present invention may be a "stand-alone" configurable counter in which case PLC 37 and input device 35 might take the form of various operator interface devices (e.g., a keyboard) for simply inputting user parameters and counter configuration selection.

Figure 2:
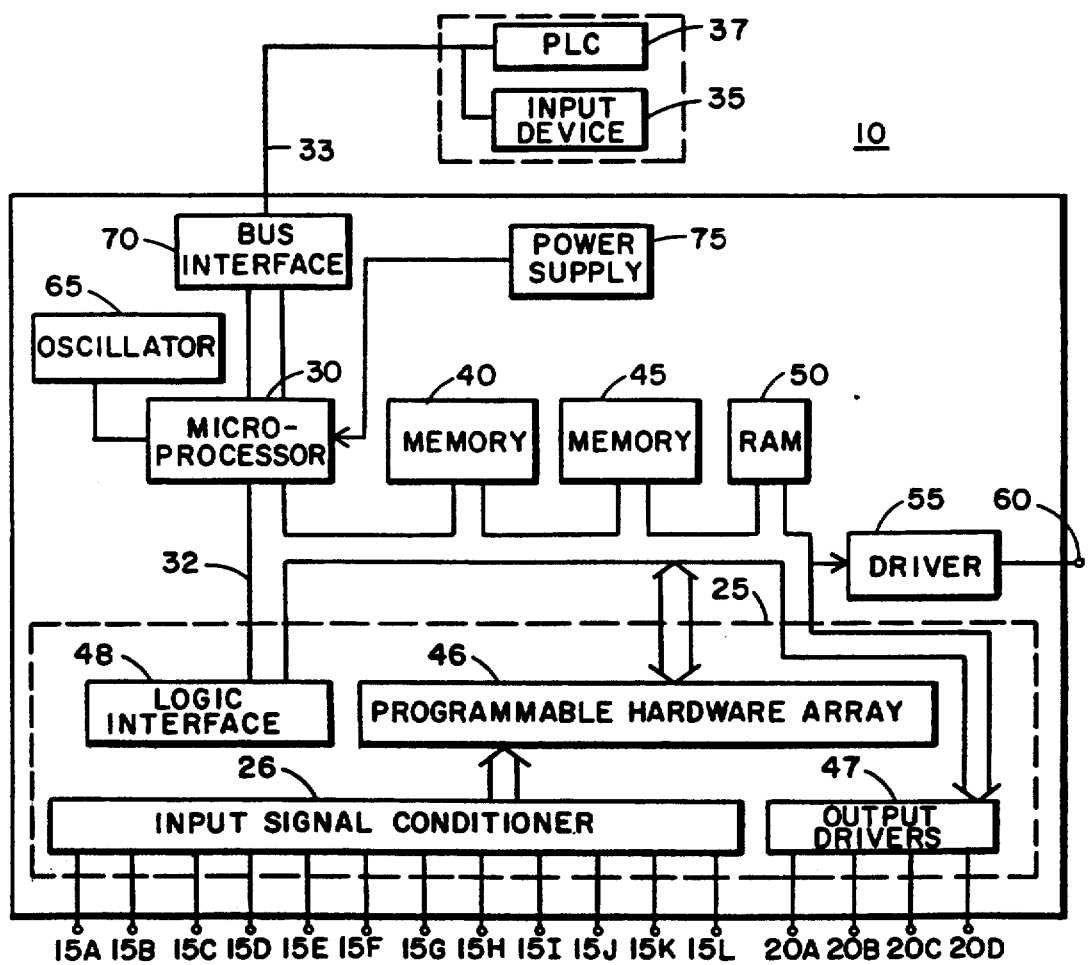
FIG. 2 is a more detailed system block diagram of the reconfigurable high speed counter of FIG. 1.

One embodiment of high speed counter (HSC) 10 is shown in more detail in the block diagram of FIG. 2. In this particular embodiment, reconfigurable counter portion 25 includes an input signal conditioning circuit 26 for conditioning and buffering data signals which are provided to conditioning circuit 26 from a controlled process or other source. Conditioning circuit 26 includes twelve inputs 15A-15L as seen in FIG. 2. These counter inputs 15A-15L provide counter control functions such as count signals, count direction, count disable, preload, marker and strobe. Counter inputs 15A-15L may be configured as necessary for each counter configuration type as will be explained later. After conditioning and buffering the data signals, conditioning circuit 26 provides the resultant conditioned data signals to a programmable hardware array 46 which is coupled to conditioning circuit 26. One programmable hardware array which may be employed as array 46 is a XILINX device currently manufactured by XILINX, Inc. and Advanced Micro Devices (AMD). Programmable hardware array 46 is configured or programmed to exhibit one of three counter configurations which is selected by the user via input device 35. The manner in which array 46 is configured will be discussed in more detail later.

Programmable hardware array 46 then performs counting operations on the conditioned data signals provided thereto according to the particular counter configuration which has been selected for array 46 by the user and having certain user parameters selected by the user. An output driver circuit 47 is coupled to microprocessor 30 via bus 32 as shown in FIG. 2 such that one or more count signals are provided to output driver circuit 47. In this particular embodiment of the invention, array 46 may be configured to be one, two or four counters of varying complexity. Thus, output driver circuit 47 is provided with four outputs 20A, 20B, 20C and 20D wherein for the least complex counter configuration (four simple counters) one output is provided for each of the four simplest counters; for the medium complexity counter configuration (two counters) two outputs per counter are provided; and for the most complex counter configuration (1 counter) all four outputs are provided to the single complex counter. Counter outputs 20A, 20B, 20C and 20D are available to the user for driving externally connected devices such as indicating lights, solenoids or relays as may be desired in response to a particular condition (count value) of the accumulators (discussed later) in high speed counter 10.

Counter portion 25 includes a logic interface 48 which couples programmable hardware array 46 to microprocessor 30 as shown in FIG. 2. A common bus 32 couples microprocessor 30 to PROM 40, EPROM 45, programmable hardware array 46 and logic interface 48. Microprocessor 30 is also connected by logic bus 32 to a random access memory (RAM) 50 which provides temporary storage memory which is used by microprocessor 30 as it operates. A clock oscillator 65 is coupled to microprocessor 30 to provide a time base signal or system clock signal for microprocessor 30. In this particular embodiment of the invention, oscillator 65 operates at a frequency of 10.88 MHz, although those skilled in the art will appreciate that other clock oscillator frequencies may be employed as well in other embodiments of the invention. Microprocessor 30 includes a variable frequency oscillator which is coupled to driver circuit 55 via bus 32. Oscillator circuit 55 includes an output 60. The frequency of the oscillator output signal generated at oscillator output 60 is programmably controlled by microprocessor 30 as will be seen later.

Counter 10 includes a DC power supply 75 which supplies all of the DC operating voltages required by the circuits and devices of high speed counter 10 as symbolized by the connection between supply 75 and microprocessor 30. For sake of brevity, the connections of power supply 75 to the remaining circuits and devices of counter 10 are not shown. A suitable design for DC power supply 75 is well known to those skilled in the art.

A bus interface 70 is coupled between programmable logic controller 37 and microprocessor 30 as shown in FIG. 2 to interface controller 37 with microprocessor 30.

It will be recalled that microprocessor 30 is coupled to EEPROM 45 which contains the user parameters which may be imposed on the selected counter configuration. The contents of memory 45 are used by microprocessor 30 following the power up sequence to configure the programmable hardware array 46. Thus, memory 45 serves also as a pointer or selector to indicate to microprocessor 30 which of the configurations from memory 40 is to be programmed into the hardware logic array 46. In this particular embodiment of the invention, three different counter configuration files are stored in PROM 40. These counter configuration profiles herein. The user can select any one of the three counter configuration files (profiles). Those skilled in the art will appreciate that a greater or lesser number of counter configuration files may be stored in PROM 40 for selection by the user. In the present embodiment, the three counter configuration parameter files correspond to three different counter configurations designated Type A, Type B and Type C which may be programmed into programmable hardware array 46. The nature of Type A, Type B and Type C counter configurations will be described in more detail subsequently. The user selects the desired one of counter configuration Types A, B and C and indicates that choice to microprocessor 30 via input device 35 or other suitable host device.

Microprocessor 30 then writes the counter configuration parameter file corresponding to the selected counter type to array 46. The user parameter file continues to reside in EPROM 45 even after power to counter 10 is turned off. Thus, on subsequent power up sequences EEPROM 45 is looked to as a pointer or selector so that the same counter configuration file which was stored earlier in EPROM 45 is used to determine how to configure array 46 from the configuration files in PROM 40 and the user parameters in EEPROM 45 until such time as the user loads a different user parameter file into EEPROM 45.

TYPE A COUNTER CONFIGURATION

The reconfiguration of high speed counter 10 under user control to one of several counter types (Types A, B or C) consequently redefines the inputs 15A-15L and the outputs 20A-20D of high speed counter 10. Moreover, the internal structure of programmable hardware array 46, is reconfigured according to the particular counter type selected. For example, when the user selects a Type A counter configuration, array 46 is configured into four independent substantially similar counters 100, 101, 102 and 103 as shown in the symbolic diagram of FIG. 3. Although counters 101, 102 and 103 are essentially the same as counter 100, the internal structure of counters 101, 102 and 103 is nevertheless shown in FIG. 3 along with the internal structure 100 for sake of completeness.

Whereas the operation of Type A counter 100 will be described in detail subsequently, the operation of the independently operating replicate Type A counters 101, 102 and 103 is understood to be substantially similar to the operation of Type A counter 100. Type A counter 100 input terminal 15A is analogous in operation to Type A counter 101 input terminal 15D, Type A counter 102 input terminal 15G and Type A counter 103 input terminal 15J. In a like manner the respective Type A counter input terminals 15E, 15H and 15K are analogous in their operation to Type A Counter 100 input terminal 15B. Similarly, terminals 15F, 15I and 15L are analogous in their operation to Type A counter 100 input terminal 15C. Furthermore, Type A counter outputs 20B, 20C and 20D each have analogous operational characteristics to the operational characteristics of Type A counter 100 output 20A.

Figure 3:
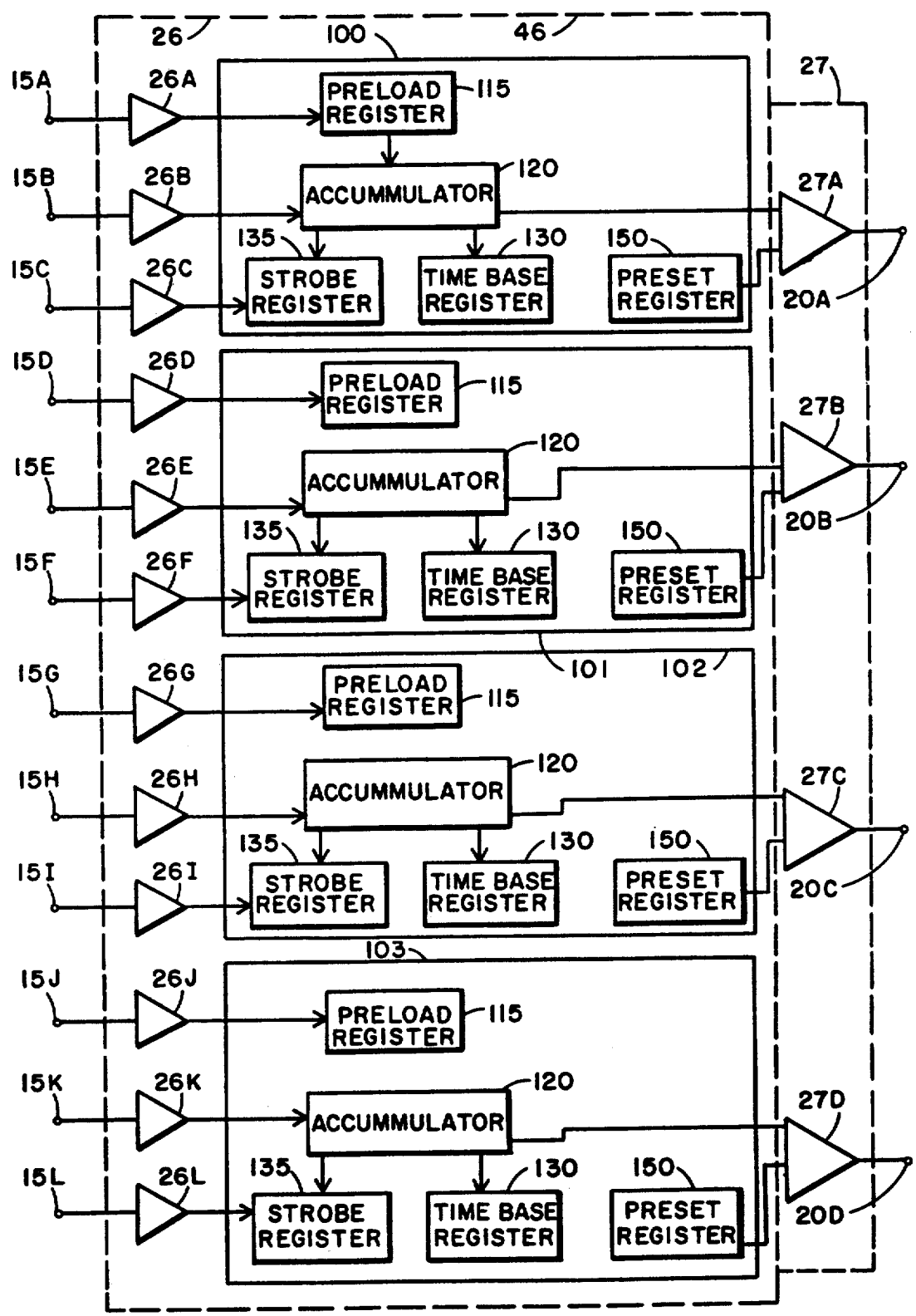
FIG. 3 is a symbolic diagram of a programmable hardware array configured to a Type A relatively low complexity counter configuration.

Type A counter 100 includes a counter preload input 15A which is coupled via conditioning circuit 26 to preload register 115. Preload register 115 may be set to any value within the counter range as will be shown later. Preload register 115 is connected to a preload input of accumulator 120 as shown in FIG. 3. Counter input 15B is also coupled to an input of accumulator 120. Preload register 115 is normally used to perform a reset function and can load its register contents into accumulator 120 upon receiving the proper input signal from preload input 15A. The contents of preload register 115 are also loaded into the accumulator 120 during the power up sequence of high speed counter 10.

Accumulator 120 of counter 100 is coupled to a time base register 130 and to a strobe register 135 to which is coupled a strobe input 15C. After the application of the proper signal to strobe input 15C, the contents of accumulator 120 are loaded into strobe register 135. In the preferred embodiment of the invention, strobe input 15C is sensitive to signal edges and can be programmed to respond to either a positive signal edge or a negative signal edge. When the appropriate signal edge occurs at input 15C, the contents of accumulator 120 are copied into strobe register 135, thus overwriting the previous contents of strobe register 135. This permits a count value to be captured in response to an external event (strobe) without affecting the counting process itself.

It is noted that in the different possible counter configurations, counter inputs used as strobe inputs are edge sensitive. The active strobe signal edge, whether it is a leading edge or a trailing edge, is defined by the counter configuration to specify either the positive leading edge or negative trailing strobe signal edge to be active.

At predetermined time base intervals the contents of accumulator 120 are loaded into time base register 130. In this embodiment of the invention, time base register 130 is a 16 bit register which contains the number of counts that have occurred in a selected time period exhibiting a duration between 1 millisecond and 65535 milliseconds. The time period is selected by programmable logic controller 37 via bus 33 and interface 70.

Accumulator 120 in counter 100 is coupled to output comparator 27A. Counter 100 includes a preset register 150 with preset values, an ON point and an OFF point being associated therewith. The preset register 150 is also connected to output driver 27A which includes an output 20A. Output 20A of output driver 27A indicates when the contents of accumulator 120 are between the two preset values contained in preset register 150. The polarity of the output 20A can be configured by programmable logic controller 37 to be ON between the two preset values. The set point condition can be configured by programmable logic controller 37 to either include or exclude the preset points.

The contents of strobe register 135, time base register 130, preload register 115 and ON/OFF preset registers 150 are made available to programmable logic controller 37 each time that the high speed counter 10 is interrogated by controller 37 via bus 33 and bus interface 70. In addition, controller 37 can write to preload register 115 and to preset register 150 as required for the normal operation of high speed counter 10. The time base value controlling the time base register 130 is programmed by programmable logic controller 37.

In a manner similar to counter 100 to which output driver 27A is coupled, output drivers 27B, 27C and 27D are coupled to counters 101, 102 and 103 as seen in FIG. 3. The outputs of drivers 27B, 27C and 27D form outputs 20B, 20C and 20D, respectively.

It will be recalled that in the present example, high speed counter 10 has been reconfigured into the Type A counter configuration, namely, four substantially similar and independent Type A counters are configured in the programmable array 46. Type A counter 100 is replicated four times in array 46 as represented by counters 100, 101, 102 and 103. Stated alternatively, programmable hardware array 46 has been configured to represent four independently operating essentially identical counters of the Type A counter configuration. It is noted that all twelve inputs 15A-15L and all four outputs 20A-20D have been utilized.

It will also be recalled that data signals supplied to the counter inputs 15A-15L are conditioned and buffered in respective input signal conditioners collectively shown as conditioner 26 in FIG. 2 and FIG. 3. As seen in FIG. 3, each of inputs 15A-15L is provided with a respective input signal conditioner 26A-26L. Input signal conditioners may be of two different types, namely single ended input or differential input. A mixture of single-ended input signal conditioners and differential input signal conditioners are used as conditioners 26A-26L in conditioner 26. It is noted that input signal conditioners 26 are fixed, that is, conditioners 26 are not a part of the programmable hardware array 46.

Figure 4A:
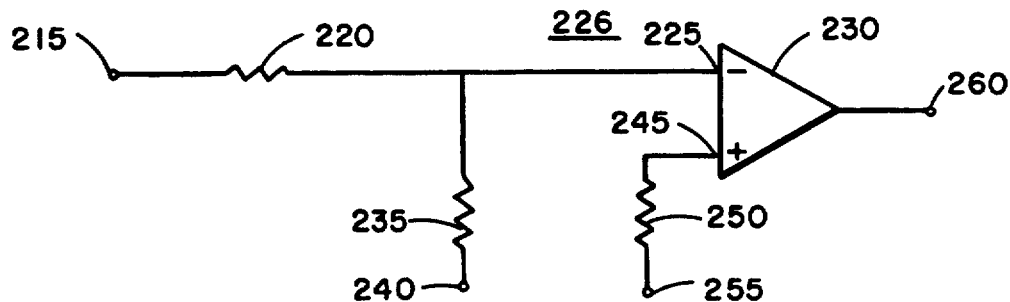
FIG. 4A is a single-ended input signal conditioning circuit which is coupled to selected counter inputs.

FIG. 4A shows a typical single-ended conditioning circuit 226 which may be employed as one or more of the conditioning circuits 26A-26L in signal conditioner 26. In conditioning circuit 226 a single-ended signal input 215 is coupled via a resistor 220 to the negative input 225 of differential amplifier 230. Negative input 225 is coupled via a resistor 235 to a terminal 240 on which a zero voltage is impressed. The positive input 245 of differential amplifier 230 is connected via a resistor 250 to a terminal 255 on which a selected reference voltage potential is impressed. In the preferred embodiment of the invention, resistors 220, 235 and 250 each have resistance values of approximately 2000 ohms. Each of the inputs 15A, 15C, 15D, 15F, 15G, 15I, 15J and 15L is coupled through respective single ended conditioning circuits typified by conditioning circuit 226 to counters 100, 101, 102 and 103 in the manner shown in FIG. 3. That is, single ended conditioning circuits such as conditioning circuit 226 are employed for conditioning circuits 26A, 26C, 26D, 26F, 26G, 26I, 26J and 26L. The remaining conditioning circuits 26B, 26E, 26H and 26K employ differential input conditioning circuits such as differential input conditioning circuit 326 shown in detail in FIG. 4B and discussed below.

Figure 4B:
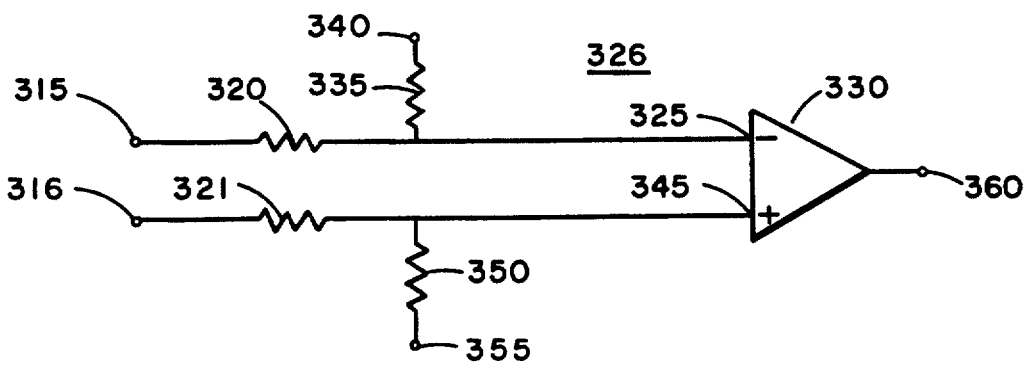
FIG. 4B is a differential input signal conditioning circuit which is coupled to other selected counter inputs.

More specifically, FIG. 4B shows a typical differential input conditioning circuit 326 including a signal input 315 which is coupled via a resistor 320 to the negative input 325 of a differential amplifier 330. Negative input 325 is coupled via a resistor 335 to a terminal 340 on which a zero voltage is impressed. A signal input 316 is coupled via a resistor 321 to the positive input 345 of differential amplifier 330. Positive input 345 is coupled via a resistor 350 to a terminal 355 on which a selected reference voltage potential is impressed. Input 315 and input 316 form a differential input pair. In the preferred embodiment of this invention resistors 320, 321, 335 and 350 each have resistance values of approximately 2000 ohms.

Each of inputs 15B, 15E, 15H and 15K of the Type A counter of FIG. 3 are coupled to differential input signal conditioning circuits such as circuit 326. That is, differential input signal conditioning circuit 326 is employed as signal conditioning circuits 26B, 26E, 26H and 26K in FIG. 3. It is noted that although, inputs 15B, 15E, 15H and 15K are differential inputs, they can be used as single ended inputs by leaving the respective terminals corresponding to the negative differential input 316 unconnected.

Each of the twelve inputs 15A-15L is provided with a high frequency noise filter (not shown) of the type which passes counter signals at frequencies preferably up to 200 Kilohertz but attenuates higher frequency noise components. It is noted that input signal conditioning circuit 26 can be configured by programmable logic controller 37 to provide control inputs 15A, 15C, 15D, 15F, 16G, 15I, 15J and 15L with respective low frequency filters (not shown) on an individual counter basis. Such low frequency signal filters are used to eliminate erroneous signal fluctuations which may be present due to contact bouncing in associated process equipment. The design and construction of the such noise filters are well known to those skilled practitioners of the art and is not detailed herein.

The status or state of each of outputs 20A-20D is always made available by programmable hardware array 46 to programmable logic controller 37 via microprocessor 30, bus 32, bus 33 and bus interface 70. Similarly, programmable logic controller 37 can access the state of the various registers within each counter.

TYPE B COUNTER CONFIGURATION

Figure 5:
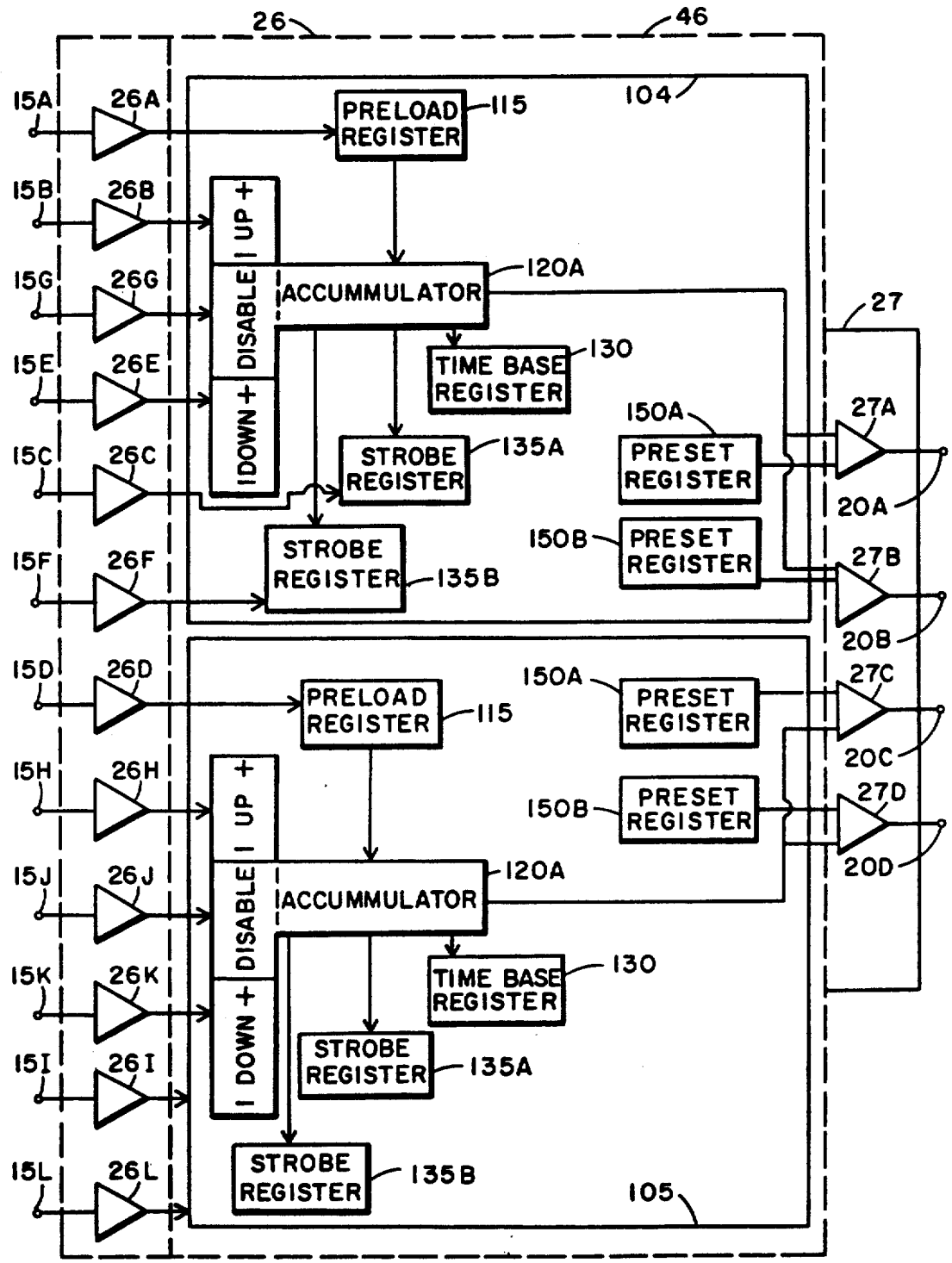
FIG. 5 is a symbolic diagram of a programmable hardware array configured to a medium complexity Type B counter configuration.

FIG. 5 shows a symbolic diagram of programmable hardware array 46 reconfigured into a Type B counter configuration which includes two independently operating medium complexity counters 104 and 105. Although counter 105 is substantially similar to counter 104, the structures of both counters 104 and 105 are illustrated in detail in FIG. 5 for sake of completeness. Although programmable hardware array 46 of FIG. 5 is configured with Type B counters, it is noted that those inputs 15A, 15C, 15D, 15F, 15G, 15I, 15J and 15L which were single-ended inputs in the Type A counter configuration of FIG. 3 are likewise single-ended in the Type B counter configuration of FIG. 5. Similarly those inputs 15B, 15E, 15H and 15K which were differential inputs in the Type A counter configuration of FIG. 3 are likewise differential in the Type B counter configuration of FIG. 5. In comparing the configurations of FIG. 3 and FIG. 5, like numerals are used to designate like elements. It is noted that many elements are common between the Type A configuration of FIG. 3 and the Type B configuration of FIG. 5, although the connections between such elements may vary as subsequently described.

Type B counter configuration 104 includes an input 15A which is coupled to the input of preload register 115. The output of preload register 115 is coupled to an input of an accumulator 120A. Counter input 15B, counter input 15E and disable input 15G are coupled to respective inputs of accumulator 120A. Accumulator 120A is coupled to one input of output driver 27A and to one input of output driver 27B as shown in FIG. 5. A first ON/OFF preset register 150A is coupled to the remaining input of output driver 27A. Output driver 27A is coupled to output 20A. A second ON/OFF preset register 150B is coupled to the remaining input of output driver 27B. Output driver 27B is coupled to output 20B.

Each of the two above mentioned preset registers 150A and 150B have two preset values associated therewith, namely an ON point and an OFF point. The state of output 20A of output driver 27A indicates whent the contents of accumulator 120A are between the preset values contained in preset register 150A. The state of output 20B of output driver 27B indicates when the contents of accumulator 120A are between the preset values contained in the preset register 150B. The polarity of outputs 20A and 20B can be configured by programmable logic controller 37 to be ON (+5 volts or greater) between the two preset values or OFF (0 volts) between the two preset values. The set point condition can conveniently be configured by the programmable logic controller 37 either to include or exclude the preset points.

Accumulator 120A is coupled to time-base register 130 into which the accumulator 120A contents are loaded at regular timed intervals depending on the selected time base interval. In the preferred embodiment of the invention, time-base register 130 is a 16 bit register which contains the number of counts that have occurred in a selected time period of between 1 millisecond and 65535 milliseconds. The time period is selected by the programmable logic controller using interface 33. The above time period is given for purposes of example. It should be understood that the invention is not limited to such a time period and that other shorter or longer time periods may also be attained.

Accumulator 120A is also coupled to a first strobe register 135A and a second strobe register 135B such that the accumulator contents are provided thereto. Strobe registers 135A and 135B include inputs 15C and 15F, respectively. When an appropriate signal is introduced to input 15C which is coupled to an input of first strobe register 135A, the contents of accumulator 120A are down-loaded into first strobe register 135A. Similarly, when an appropriate signal is introduced to input 15F of second strobe register 135B, the contents of accumulator 120A are down-loaded into second strobe register 135B.

In the preferred embodiment of the invention, strobe inputs 15C and 15F are sensitive to signal edges and can be programmed to respond to either a positive edge or a negative edge of a data signal. When the appropriate signal edge occurs on input 15C, the contents of the accumulator 120A are copied into strobe register 135A thus overwriting the previous contents of strobe register 135A. When the appropriate signal edge occurs on input 15F, the contents of the accumulator 120A are copied into strobe register 135B thus overwriting the previous contents of strobe register 135B.

The contents of strobe registers 135A, 135B, time-base register 130, preload register 115, and ON/OFF preset registers 150A and 150B are made available to the programmable logic controller 37 each time that the high speed counter 10 is interrogated by controller 37 via bus 33 and bus interface 33. Moreover, programmable logic controller 37 can write to preload register 115 and to preset registers 150A and 150B as required for the normal operation of the high speed counter 10. The time-base value controlling time-base register 130 is programmed by the programmable logic controller 37.

Type B counter 105 is substantially similar in configuration to Type B counter 104. Input 15D of counter 105 corresponds in function to input 15A of counter 104. Input 15H of counter 105 corresponds in function to input 15B of counter 104. Input 15J of counter 105 corresponds in function to input 15G of counter 104. Input 15K of counter 105 corresponds in function to input 15E of counter 104. Input 15I of counter 105 corresponds in function to input 15C of counter 104. Input 15L of counter 105 corresponds in function to input 15F of counter 104.

It will be appreciated that in the Type B counter configuration, programmable hardware array 46 has been configured to represent two independently operating substantially similar medium complexity counters. All twelve inputs 15A-15L and all four outputs 20A-20D have been utilized in the Type B configuration.

TYPE C COUNTER CONFIGURATION

Figure 6:
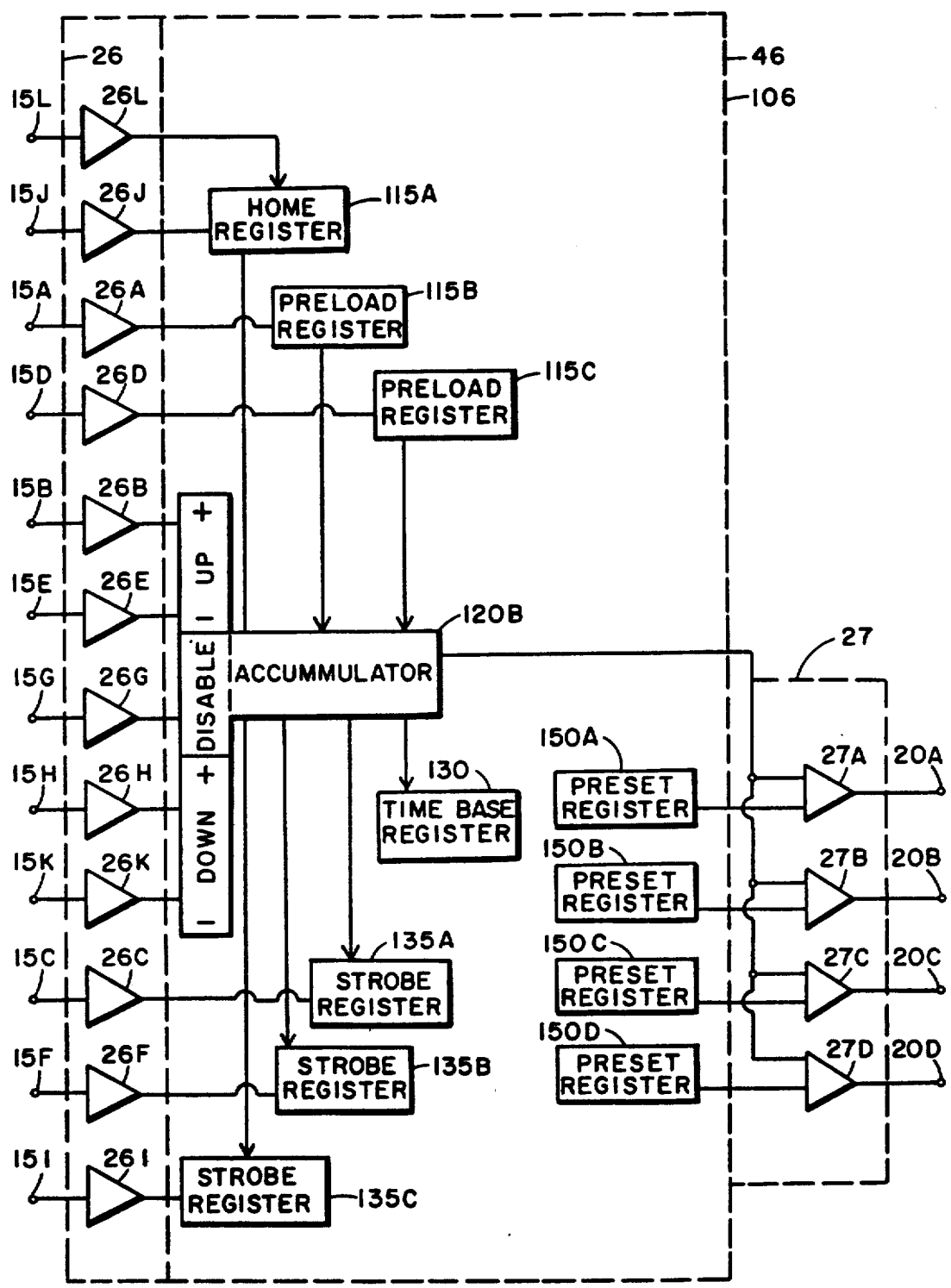
FIG. 6 is a symbolic diagram of a programmable hardware array configured to a relatively high complexity Type C counter configuration.

FIG. 6 shows a symbolic block diagram of programmable hardware array 46 reconfigured into a single relatively high complexity Type C counter configuration. Although programmable hardware array 46 shown in FIG. 6 is configured to Type C counter 106, it is noted that those inputs 15A, 15C, 15D, 15F, 15G, 15I, 15J and 15L, which were single ended inputs in counter configuration Type A of FIG. 3 and counter configuration Type B of FIG. 5, are likewise single-ended inputs in counter configuration Type C of FIG. 6. Similarly those inputs 15B, 15E, 15H and 15K which were differential inputs in the Type A and B configurations likewise exhibit differential inputs in the Type C configuration. In comparing the configurations of FIG. 3 (Type A) and FIG. 5 (Type B) with the configuration of FIG. 6 (Type C), like numerals are used to designate like elements. It is noted that many elements are in common between the configurations of FIG. 3, FIG. 5 and FIG. 6, although the connections between such elements may vary.

Referring now to FIG. 6, input 15L is designated marker input 15L and input 15J is designated limit-switch input 15J. Marker input 15L and limit switch input 15J are coupled to home position register 115A as seen in FIG. 6. Home position register 115A is coupled to accumulator 120B. Home position register 115A down-loads its contents into accumulator 120B on the occurrence of the first low to high signal transition on input 15L while input 15J is active.

Counter configuration 106 includes a first preload register 115B, the input of which is coupled to input 15A via signal conditioning circuit 26 which has already been described in detail. The output of first preload register 115B is coupled to an input of accumulator 120B. The contents of first preload register 115B are down-loaded to accumulator 120B when an appropriate data signal is applied to input 15A. Second preload register 115C includes an input which is coupled to input 15D. The output of second preload register 115C is coupled to an input of accumulator 120B. The contents of second preload register 115C are down-loaded to accumulator 120B when an appropriate data signal is applied to input 15D.

Accumulator 120B includes respective inputs which are coupled to count input 15B, count input 15E, count input 15H, count input 15K and disable input 15G. Accumulator 120B is coupled to time-base register 130 into which the accumulator 120B contents are loaded at regular timed intervals depending on the selected time base interval. In the preferred embodiment of the invention, time-base register 130 is a 16 bit register which contains the number of counts that have occurred in a selected time period of between 10 milliseconds and 65535 milliseconds. Alternative embodiments employing other time periods are contemplated and are within the scope of the invention. The time period is selected by programmable logic controller 37 using bus 33 and interface 70.

Accumulator 120B is also coupled to first strobe register 135A, to second strobe register 135B and to third strobe register 135C. First strobe register 135A includes an input which is coupled to input 15C. Second strobe register 135B includes an input which is coupled to input 15F. Finally, third strobe register 135C includes an input which is coupled to an input 15I. When an appropriately conditioned data signal is introduced to input 15C of first strobe register 135A, the contents of accumulator 120B are down-loaded into first strobe register 135A. Similarly, when an appropriate data signal is introduced to input 15F of second strobe register 135B, the contents of accumulator 120B are down-loaded into second strobe register 135B. Likewise, when an appropriate data signal is provided to input 15I of third strobe register 135C, the contents of accumulator 120B are down-loaded into third strobe register 135C.

In the preferred embodiment of the invention, strobe inputs 15C, 15F and 15I are sensitive to signal edges and can be programmed to respond to either a positive edge or a negative edge. When the appropriate signal edge occurs on input 15C, the contents of the accumulator 120B are copied into strobe register 135A so as to overwrite the previous contents of the strobe register 135A. Similarly, when the appropriate signal edge occurs on input 15F, the contents of accumulator 120B are copied into strobe register 135B, thus overwriting the previous contents of the strobe register 135B. Likewise, when an appropriate signal edge occurs on input 15I, the contents of the accumulator 120B are copied into strobe register 135C so as to overwrite the prior contents of the strobe register 135C.

Accumulator 120B is coupled to a first input of output driver 27A, to a first input of output driver 27B, to a first input of output driver 27C and to a first input of output driver 27D. The second input of output driver 27A is coupled to first ON/OFF preset register 150A. Output driver 27A includes an output designated 20A as seen in FIG. 6. The second input of output driver 27B is coupled to second ON/OFF preset register 150B. Output driver 27B includes an output 20B. The second input of output driver 27C is coupled to third ON/OFF preset register 150C. Output driver 27C includes an output designated 20C. The second input of output driver 27D is coupled to fourth ON/OFF preset register 150D. Output driver 27D includes an output designated output 20D.

Each of the four preset registers 150A, 150B, 150C and 150D associated with Type C counter configuration 106 exhibit preset values including an ON point and an OFF point. The state of output 20A of output driver 27A indicates when the contents of accumulator 120 are between the two preset values contained in the preset register 150A. The output 20B of output driver 27B indicates when the contents of accumulator 120B are between the two preset values contained in the preset register 150B. Further, the output 20C of output driver 27C indicates when the contents of accumulator 120B are between the two preset values contained in the preset register 150C. Similarly, the output 20D of output driver 27D indicates when the contents of accumulator 120B are between the two preset values contained in the preset register 150D.

The polarity of the outputs 20A, 20B, 20C and 20D can be configured by programmable logic controller 37 to be ON between the preset values or OFF between the preset values. The set point condition can be configured by programmable logic controller 37 to either include or exclude the preset points. In this manner, external user circuitry connected to outputs 20 is made responsive to the count in accumulator 120B based on the user preset values in preset registers 150A, 150B, 150C and 150D.

From the above, it will be appreciated that the programmable hardware array 46 has been configured to represent one relatively high complexity counter 106 of the Type C counter configuration and that all twelve inputs 15 and all four outputs 20 have been utilized.

HIGH SPEED COUNTER SIGNALS AND RELATED COUNTER OPERATION

After the programmable hardware array logic 46 is configured into either Type A counters or Type B counters or a Type C counter, the counter inputs 15B, 15G, 15E, 15H, 15J and 15K are employed as inputs for various modes of the configured counter operation as described subsequently.

Figure 7A:
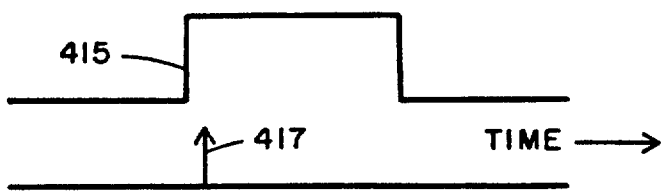
FIG. 7A represents a count input signal and count occurrence in the up-counter mode for the Type A counter of FIG. 3.

Each of type A counters 100, 101, 102 and 103 can be individually programmed by commands on bus 33 from the programmable logic controller 37 to operate as either an up-counter or a down-counter. That is, some of Type A counters 100, 101, 102 and 103 may be programmed as up-counters while the remaining ones of counters 100, 101, 102 and 103 may be programmed as down-counters. In the example of FIG. 7A it is assumed that a Type A counter 100 has been programmed by commands from PLC 37 over bus 33 to act as a up-counter. Shown in FIG. 7A is a typical input data signal 415 drawn on a horizontal time axis and present at input 15B. Also drawn in FIG. 7A is an up-count event 417 showing the time relationship between the leading edge of signal 415 and the subsequent up-count event 417. Accumulator 120A is incremented by one count during such an up-count event 417.

Figure 7B:
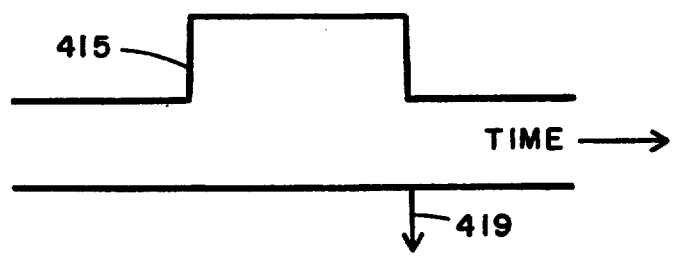
FIG. 7B represents a count input signal and count occurrence in the down-counter mode for the Type A counter of FIG. 3.

In the example of FIG. 7B it is assumed that type A counter 100 has been programmed by commands from PLC 37 over bus 33 to act as a down-counter. FIG. 7B shows the time relationship between an input signal 415 on input 15B of counter 100 and a down-count event 419. In the down-counter mode the down-count event 419 occurs after the negative signal edge of counter input signal 415 and, accordingly, accumulator 120A is decremented by one count during down-count event 419.

Figure 8A:
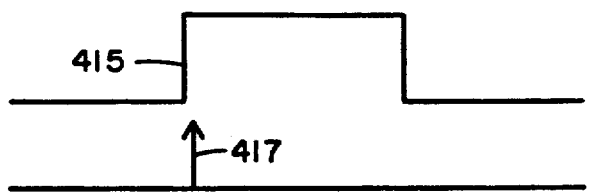
FIG. 8A represents a count input signal and count occurrence in the up-counter mode for the Type B and Type C counters.
Figure 8B:
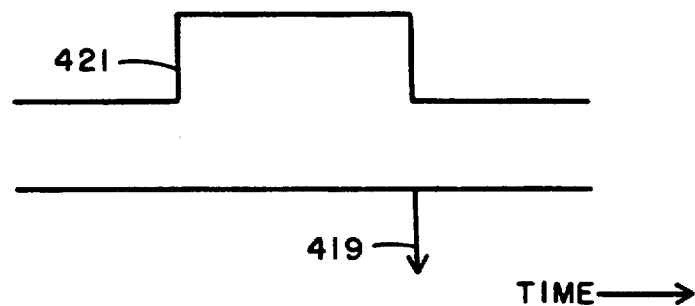
FIG. 8B represents a count input signal and count occurrence in the down-counter mode for the Type B and Type C counters.

Type B counters 104 and 105 can be programmed by commands on bus 33 from programmable logic controller 37 to operate in one of three modes. The first mode is an up-down mode where, as shown in the signal vs. time diagram of FIG. 8, signal 415 is shown versus time as applied to input 15B. That is, counter input 15B is designated to receive signal 415. When an up-count event 417 follows the leading edge of signal 415 as shown in FIG. 8, counter 104 increments accumulator 120A by one count. Simultaneously, counter input 15E is designated to receive a signal 421. Down-count event 419 follows the trailing edge of signal 421 as shown in the lower portion of FIG. 8 and counter 104 decrements accumulator 120A by one count. Accumulator 120B thus accumulates the difference count between the number of leading edges of signal 415 on input 15B and the number of trailing edges of signal 417 on input 15E. That is, accumulator 120B accumulates the difference count between the number of up-count events 417 and down-count events 419. It is noted that when Type B counter 104 is operating in the above described first mode (up/down counter mode), an appropriate signal level on disable input 15G will inhibit the operation of the counter 104 for the duration of the disable signal. In a like manner, the replicate Type B counter 105 can also be programmed to operate in the up/down counter mode and can be similarly disabled.

Figure 9A:
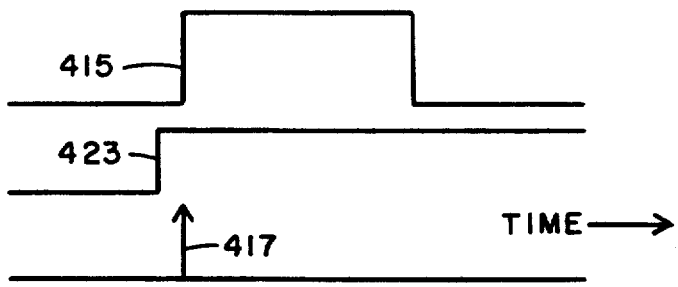
FIG. 9A represents the count and direction input signals and the count occurrence for the pulse direction counter in the Type C counter.
Figure 9B:
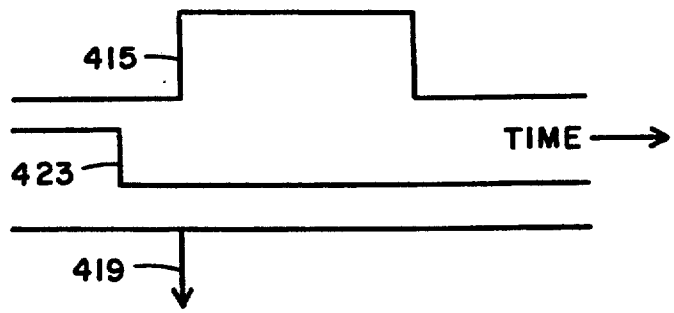
FIG. 9B represents the count and direction input signals and the count occurrence for the pulse direction counter in the Type C counter.

The second mode of operation of Type B counters 104 or 105 is the pulse-direction mode which is best illustrated by reference to the signal versus time diagrams of FIG. 9A and FIG. 9B. The input signal on counter input 15E is defined to be input signal 423 as shown in FIG. 9A. When input signal 423 is high, the occurrence of a leading edge transition of input signal 415 on input 15B results in an up-count event 417. The occurrence of such an up-count event results in an increment of the counter contents of accumulator 120A by one count. A low signal 423', as shown in FIG. 9B, on counter input 15E causes a down-count event 419 which results in the counter contents of accumulator 120A being decremented by one count. Thus, the polarity of signal (423 or 423') on counter input 15E controls whether the counter increments or decrements the contents of accumulator 120A. This direction signal may change polarity at any instance during the counting process without affecting the integrity of the expected results in accumulator 120. When the counter is incrementing, positive leading signal edges are counted whereas when the counter is decrementing, negative trailing edges are counted. It is noted that when Type B counter 104 is operating in the above discussed second mode (pulse direction mode), an appropriate signal level on disable input 15G will again inhibit the operation of the counter 104 for the duration of the disable signal. In a like manner, the replicate Type B counter 105 can also be programmed to operate in the pulse direction mode and can be similarly disabled.

Figure 10A:
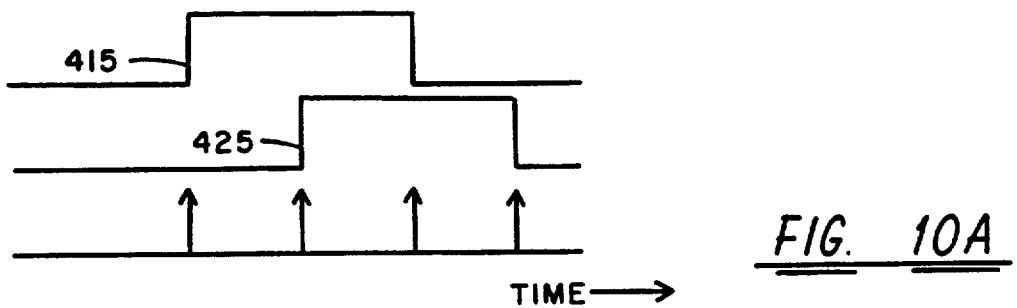
FIG. 10A shows input signals and count occurrences for up-counting with an A quad B counter in the Type B and Type C counters.
Figure 10B:
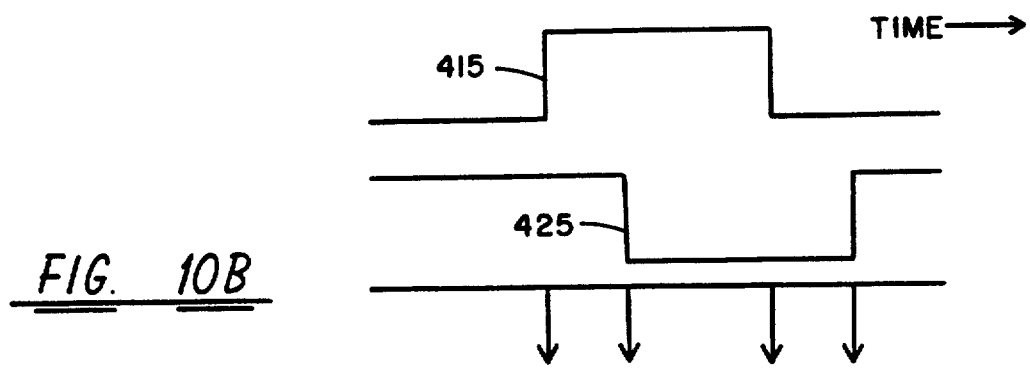
FIG. 10B shows input signals and count occurrences for down-counting with an A quad B counter in the Type B and Type C counters.

The third mode of operation of Type B counters 104 or 105 is the A quad B mode which is best illustrated by reference to the signal versus time diagrams of FIG. 10A and FIG. 10B. The phase relationship between signal 415 on input 15B and signal 425 on input 15E determines the direction of the count. In FIG. 10A the positive going leading edge of signal 415 on input 15B occurs while signal 425 on input 15E is low. In that phase relationship, up-count events 417 occur following each signal transition of both signals 415 and 425. The accumulator 120A count is incremented when this input signal phase relationship occurs. In FIG. 10B the positive going leading edge of signal 415 on input 15B occurs while signal pulse 425 on input 15E is low. In that phase relationship, the counter events 419 occur following each signal transition of both signals 415 and 425′. The accumulator 120A count is decremented when this input signal phase relationship occurs. In the A quad B mode of operation for the Type B counter, four counter events are shown in FIG. 10A and FIG. 10B for each complete cycle of either signal 415 or signal 425. In this particular embodiment of the invention, up-count events 417 and down-count events 419 are recorded in a "times four" mode to provide enhanced count resolution.

It is noted that when Type B counter 104 is in the above discussed third mode (A quad B), an appropriate signal level on disable input 15G will once again inhibit the operation of the counter 104 for the duration of the disable signal. In a like manner, the replicate Type B counter 105 can also be programmed to operate in the A quad B mode and can be similarly disabled. It is also noted that Type B counters 104 and 105 need not necessarily be programmed to the same mode. That is, counter 104 may be programmed in an up/down counter mode while counter 105 is simultaneously programmed in a pulse direction mode, for example.

The Type C counter configuration 106 is a single relatively high complexity differential counter with two sets of counter inputs. The first set of counter inputs consists of inputs 15B and 15E which may be considered as the inputs of the positive loop of the counter. The modes of operation of these inputs are identical to the modes of operation of inputs 15B and 15E of Type B counter 104 as described earlier by reference to FIGS. 8-10. The second set of counter inputs consists of inputs 15H and 15K which may be considered as the inputs of the negative loop of the counter. The modes of operation of these inputs are identical to the modes of operation on inputs 15H and 15K of Type B counter 105 as described earlier by reference to FIGS. 8-10. Each set of counter inputs for the Type C counter is referred to as a counter channel. The two Type C counter channels can be independently programmed to operate in any one of the modes described for the Type B counter. These modes are the up-down counter mode, the pulse-direction mode and the A quad B counter mode. Accumulator 120B increments or decrements depending on input signal conditions on each of the two counter channels. As an example, if the first channel is receiving data signals which cause up-count events and the second channel is receiving data signals which cause down-count events, the accumulator 120B registers the sum of the events on the first and second channels. In the Type C counter 106 a proper predetermined signal level on disable input 15G will inhibit the operation of counter 106 for the duration of the disable signal.

The contents of strobe registers 135A, 135B, 135C, time-base register 130, home position register 115A, preload registers 115B and 115C, and ON/OFF preset registers 150A, 150B, 150C and 150D are made available to the programmable logic controller 37 each time that the high speed counter 10 is interrogated by controller 37 on the bus 33 via bus interface 70. In addition, controller 37 can write to home position register 115A, preload registers 115B and 115C, and to preset registers 150A 150B, 150C and 150D as required for the normal operation of high speed counter 10. The time base value controlling the time-base register 130 is programmed by programmable logic controller 37. The home position register 115A down-loads its contents to the accumulator 120B within one count period when the limit switch input 15J is active and a marker pulse input occurs on the marker input 15L. In the preferred embodiment of the invention, the home position register 115A is a 24 bit register.

Figure 11:
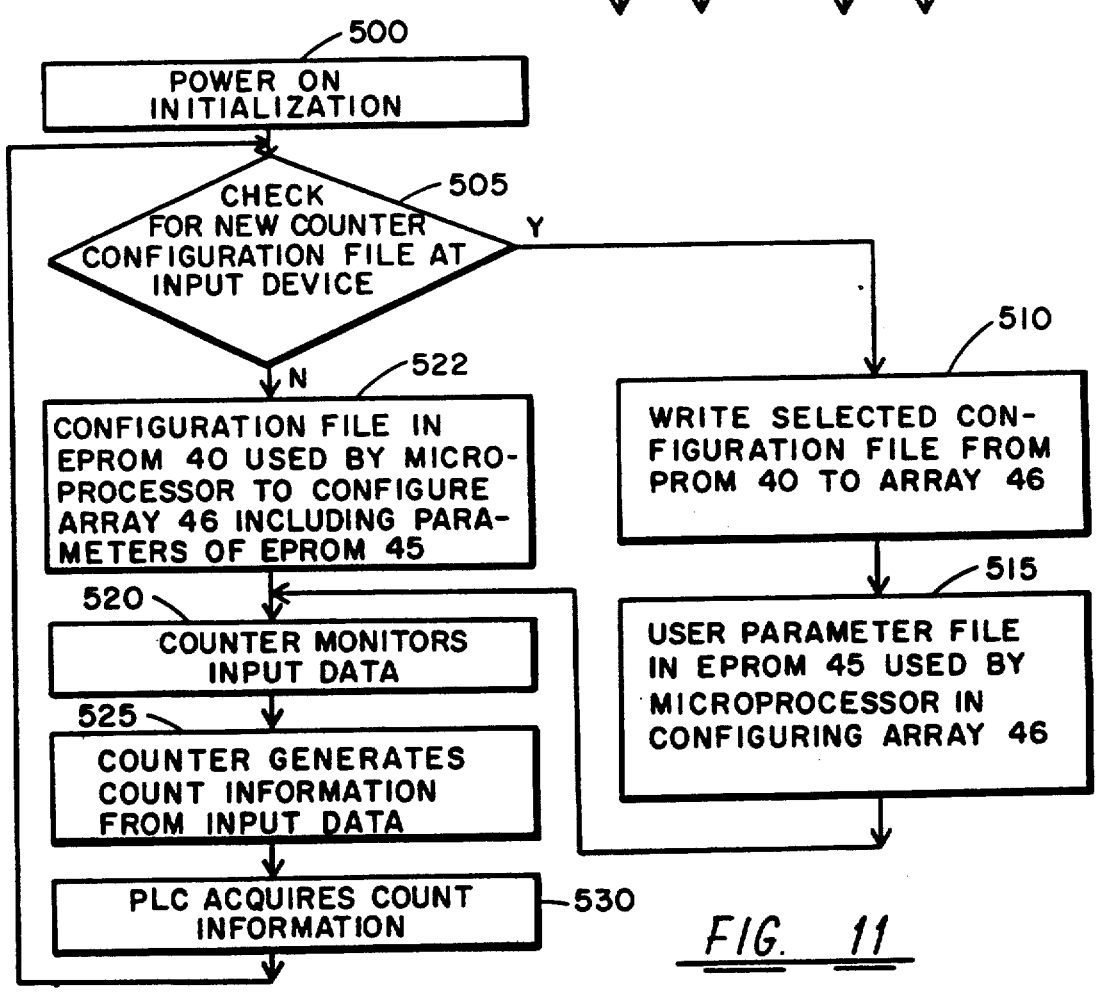
FIG. 11 is a generalized flowchart of the operation of a reconfigurable counter in accordance with the teachings of the present invention.

FIG. 11 is a generalized flowchart showing the operation of reconfigurable counter 10. At power on, microprocessor 30 is initialized as per block 500 of the flowchart of FIG. 11. A test is then performed at decision block 505 to determine whether or not a new counter configuration has been selected by the user at input device 35. If at decision block 505 it is determined that a new counter configuration file has been selected or that this is the first time that a counter configuration file has ever been selected for counter 10, then flow continues to block 510 at which the particular configuration file selected by the user is programmed from PROM 40 to array 46. Block 515 indicated that the configuration file used by microprocessor 30 to configure array 46 is determined by the pointer of memory 45 and that the selected user parameters of memory 45 are imposed on the selected configuration. Once array 46 is so configured flow continues to block 520 at which the configured counter or counters monitor the input data from the controlled process or other source.

However, if it was determined at decision block 505 that no new counter configuration has been selected by the user at input device 35, then the previous counter configuration as selected by EEPROM 45 is used by microprocessor 30 to configure array 46 as per block 522. Flow the continues from block 522 to block 520 at which the configured counter is used to monitor input data.

The counter configured in array 46 then generates count information from the input data as per block 525 in the manner previously discussed in detail. PLC 37 (or other host device) then acquires the count information from the counter or counters configured in array 46 from time to time as dictated by the particular application as per block 530. Flow then continues back to decision block 505 to determine if a new counter profile has been selected by the user. The process then continues as before. It is noted that PLC 37 need not necessarily acquire count information each time around the loop formed by blocks 505-530. That is, execution of the functional blocks within loop 505-530 will continue even if PLC 37 decides not to acquire count information at block 530 in a particular execution of loop 505-530.

Those skilled in the art will appreciate that in actual practice block 522 at which array 46 is configured need not be executed each time through loop 505-530. Rather, executing block 522 just once after initial power up of counter 10 will be sufficient to configure counter 10. Any subsequent reconfiguration requests are handled by blocks 505, 515 and 520.

While a reconfigurable counter apparatus has been described above in detail, it will be appreciated that a method for configuring and reconfiguring a counter has also been disclosd, such method including the steps of storing a plurality of user selectable counter profiles in a memory and the step of selecting one of the user selectable counter profiles thus designating a selected counter profile. The method further includes the step of configuring a programmable hardware array to exhibit a counter configuration corresponding to the selected profile. In one embodiment of the invention, the method includes the step of coupling the counter to a programmable logic controller or other host device to provide the controller with count information.

In another embodiment of the method of invention, the method includes the steps of storing a plurality of user selectable counter profiles in a first memory and the step of selecting one of the user selectable counter profiles thus designating a selected counter profile. The method further includes the step of writing the selected counter profile from the first memory to a programmable hardware array, and having imposed thereon certain user selected parameters provided by a second memory.

In yet another mebodiment of the method of the invention, a method is provided for configuring a counter including the step of storing at least first and second user selectable counter profiles in a memory, the first profile corresponding to a plurality of counters exhibiting a first counter type, the second profile corresponding to first and second counters exhibiting a second counter type. These first and second counters are capable of assuming first and second user selectable modes. The method further includes the step of selecting one of the user selectable counter profiles thus designating one of the first and second counter profiles as being the selected counter profile. The method also includes the step of selecting first and second modes for the first and second counters of the second counter type when the selected counter profile is the second counter profile, thus designating selected modes. The method further includes the step of configuring a programmable hardware array to exhibit a counter configuration corresponding to the selected counter profile and any selected modes.

The foregoing has described both a reconfigurable counter apparatus and a method for reconfiguring a counter. That is, a high speed counter (HSC) is provided which may be programmably reconfigured to one of several different hardware counter configurations. The counter advantageously provides the user a selectable functionality and cost tradeoff to meet a wide range of applications. Moreover, the counter obviates the need for stocking several different types of high speed counters for use in conjunction with PLC's, host computers, or, indeed, as a stand-alone counter using any one of a number of available operator interface devices such as a simple keypad or keyboard, and other applications.

While only certain preferred features of the invention have been shown by way of illustration, many modifications and changes will occur to those skilled in the art. For example, although first and second memories are illustrated and discussed, it will be apparent that a single memory serving the function of the first and second memories may, for some applications, be substituted. It is, therefore, to be understood that the present claims are intended to cover all such modifications and changes which fall within the true spirit of the invention.

What is claimed is:

1. A reconfigurable counter comprising:
a microprocessor;
a bus coupled to said microprocessor;
first memory means, coupled to said microprocessor by said bus, for simultaneously storing a plurality of counter configuration files which respectively define a plurality of predetermined different counters, each counter configuration file completely defining a predetermined counter having a different structural complexity;
input means, coupled to said microprocessor, for inputting selection information to said microprocessor to indicate the selection of a particular one of said counter configuration files desired by a user of said counter;
second memory means, coupled to said microprocessor by said bus, for storing said selection information;
programmable logic means, coupled to said microprocessor by said bus, for emulating the particular predetermined counter defined by the particular counter configuration file indicated by said selection information; and
said microprocessor writing to said programmable logic means the particular predetermined counter configuration file indicated by said selection information, such that said programmable logic means emulates the particular predetermined counter defined by the particular counter configuration file indicated by said selection information.

2. The counter of claim 1 wherein said first memory means comprises a non-volatile memory.

3. The counter of claim 1 wherein said second memory means comprises a programmable non-volatile memory.

4. The counter of claim 1 wherein said input means further includes means for inputting counter parameter information to said microprocessor for storage in said second memory means.

5. The counter of claim 1 wherein at least one of the counter configuration files stored in said first memory means defines a multi-mode counter including first and second modes.

6. The counter of claim 1 wherein at least one of the counter configuration files stored in said first memory means defines a miulti-mode counter including a selectable UP/DOWN counter mode, a selectable pulse direction mode and a selectable A quad B counter mode.

7. The counter of claim 1 wherein said second memory means includes a pointer to indicate the selection of a particular one of said counter configuration files stored in said first memory means.

8. A reconfigurable counter comprising:
first memory means for simultaneously storing a pluralilty of counter configuration files which respectively define a plurality of predetermined different counters, each counter configuration file completely defining a predetermined counter having a different structural complexity;
selecting means, operatively coupled to said first memory means, for selecting one of said counter configuration files for said counter;
programmable logic means, responsive to said selecting means, for emulating the particular predetermined counter defined by the partiuclar counter configuration file selected by said selecting means; and
writing means, coupled to said first memory means and said programmable logic means, for writing to said programmable logic means the particular predetermined counter configuration file selected by said selecting means, such that said programmable logic means emulates the particular predetermined counter defined by the particular counter configuration file selected by said selecting means.

9. The counter of claim 8 wherein said first memory means comprises a programmable non-volatile memory.

10. The counter of claim 8 wherein said selecting means comprises a second memory means for storing selection information which indicates which counter configuration file is to be written into said programmable logic means.

11. The counter of claim 10 wherein said second memory means comprises a non-volatile memory.

12. The counter of claim 8 wherein at least one of the counter configuration files stored in said first memory means defines multi-mode counter including selectable first and second modes.

13. The counter of claim 8 wherein at least one of the counter configuration files stored in said first memory means defines a multi-mode counter including a selectable UP/DOWN counter mode, a selectable pulse direction mode and a selectable A quad B counter mode.

14. The method of configuring a counter comprising the steps of:
storing simultaneously in a first memory a plurality of counter configuration files which respectively define a plurality of predetermined different counters, each counter configuration file completely defining a predetermined counter having a different structural complexity;
inputting selection information to said counter to indicate the selection of a particular one of said counter configuration files desired by a user of said counter; and
storing said selection information in a second memory, and
writing the counter configuration file indicated by said selection information to a programmable logic device such that said programmable logic device emulates the particular predetermined counter defined by the counter configuration file indicated by said selection information.

15. The method of claim 14 further comprising the step of inputting said selection information to a second memory in said counter to indicate the selection of a particular one of said counter configuration files by a user of said counter.

16. The method of claim 15 further comprising the steps of inputting counter parameter information to said second memory means and writing said counter parameter information to said programmable logic device to aid in configuration of said programmable logic device.

17. The method of claim 14 further comprising a substep wherein at least one of said counter configuration files stored in said first memory means defines a multi-mode counter including selectable first and second modes.

18. The counter of claim 14 further comprising a substep wherein at least one of the counter configuration files stored in said first memory means defines a muti-mode counter including a selectable UP/DOWN counter mode, a selectable pulse direction mode and a selectable A quad B counter mode.

19. A method of configuring a counter comprising the steps of:
storing simultaneously in a first memory a plurality of counter configuration files which respectively define a plurality of predetermined different counters, each counter configuration file completely defining a predetermined counter having a different structural complexity;
selecting one of said counter configuration files for said counter, the counter configuration file thus selected being designated the selected counter configuration file; and
writing the selected counter configuration file to a programmable logic device such that said programmable logic device emulates the particular predetermined counter defined by said selected counter configuration file.

20. The method of claim 19 further comprising a substep wherein at least one of said counter configuration files stored in said first memory means defines a multi-mode counter including selectable first and second modes.

21. The counter of claim 19 further comprising a substep wherein at least one of the counter configuration files stored in said first memory means defines a multi-mode counter including a selectable UP/DOWN counter mode, a selectable pulse direction mode and a selectable A quad B counter mode.

* * * * *